(12) United States Patent
Kim et al.

(10) Patent No.: US 10,410,734 B2
(45) Date of Patent: Sep. 10, 2019

(54) SHIFT REGISTER

(71) Applicant: SILICON DISPLAY TECHNOLOGY, Yongin-si (KR)

(72) Inventors: Kijoong Kim Kim, Suwon-si (KR); Jin Hyeong Yu, Dangjin-si (KR); Ji Ho Hur, Yongin-si (KR)

(73) Assignee: SILICON DISPLAY TECHNOLOGY, Yongin-si (KR)

( * ) Notice: Subject to any disclaimer, the term of this patent is extended or adjusted under 35 U.S.C. 154(b) by 198 days.

(21) Appl. No.: 15/623,548

(22) Filed: Jun. 15, 2017

(65) Prior Publication Data

US 2018/0096733 A1   Apr. 5, 2018

(30) Foreign Application Priority Data

Oct. 5, 2016   (KR) .......................... 10-2016-0128387

(51) Int. Cl.
   *G11C 19/00*   (2006.01)
   *G11C 19/28*   (2006.01)
   (Continued)

(52) U.S. Cl.
   CPC ............... *G11C 19/28* (2013.01); *G09G 3/20* (2013.01); *G09G 3/2092* (2013.01);
   (Continued)

(58) Field of Classification Search
   None
   See application file for complete search history.

(56) References Cited

U.S. PATENT DOCUMENTS

2011/0221736 A1 *   9/2011   Pak ...................... G09G 3/3677
                                                                     345/211
2016/0012764 A1 *   1/2016   Xu .......................... G11C 19/28
                                                                     345/204
(Continued)

FOREIGN PATENT DOCUMENTS

KR   10-2004-0061680   7/2004
KR   10-2004-0097503   11/2004
(Continued)

*Primary Examiner* — Tuan T Lam
(74) *Attorney, Agent, or Firm* — Lex IP Meister, PLLC (57) ABSTRACT

The present invention relates to a shift register configured of a plurality of stages applying two clock signals among four clock signals that are sequentially generated as an input and applying a start signal as the input, wherein a first stage charges the start signal to a P-node and outputs a first output signal and a first carry signal by using the voltage of the P-node as a driving voltage when a first clock signal is applied, and resets the P-node when a second clock signal is applied, a second stage pre-charges a start signal input to the first stage to the P-node, charges the first carry signal to the P-node, outputs a second output signal and a second carry signal by using the voltage of the P-node as the driving voltage when the second clock signal is applied, and resets the P-node when a third clock signal is applied, and a third stage and following stages pre-charge a carry signal of the second previous stage to the P-node, charge the carry signal of the previous stage to the P-node, output the output signal and the carry signal by using the voltage of the P-node as the driving voltage when the input clock signal secondly input to the P-node is input, and reset the P-node that is charged depending on the clock signal generated after the input clock signal.

11 Claims, 7 Drawing Sheets

(51) Int. Cl.
*G09G 3/20* (2006.01)
*G09G 3/36* (2006.01)

(52) U.S. Cl.
CPC ... *G09G 3/3677* (2013.01); *G09G 2300/0809* (2013.01); *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 2016/0141051 A1* | 5/2016 | Chen | G11C 19/28 377/75 |
| 2016/0240158 A1* | 8/2016 | Xu | G11C 19/28 |
| 2017/0110075 A1* | 4/2017 | Cao | G09G 3/3677 |
| 2018/0053471 A1* | 2/2018 | Lin | G09G 3/3266 |
| 2018/0138256 A1* | 5/2018 | Han | G09G 3/20 |

FOREIGN PATENT DOCUMENTS

| | | |
|---|---|---|
| KR | 10-2011-0000469 | 1/2011 |
| KR | 10-2012-0044681 | 5/2012 |
| KR | 10-2013-0055253 | 5/2013 |
| KR | 10-2014-0119690 | 10/2014 |
| KR | 10-2014-0122221 | 10/2014 |
| KR | 10-2014-0138441 | 12/2014 |

* cited by examiner

SHIFT REGISTER

CROSS-REFERENCE TO RELATED APPLICATION

This application claims priority to and the benefit of Korean Patent Application No. 10-2016-0128387 filed in the Korean Intellectual Property Office on Oct. 5, 2016, the entire contents of which are incorporated herein by reference.

BACKGROUND OF THE INVENTION

(a) Field of the Invention

The present invention relates to a shift register used in a driving circuit of a display device.

(b) Description of the Related Art

A display panel including a plurality of data lines and a plurality of gate lines is implemented in a fingerprint sensor, an image sensor, a display device such as a liquid crystal display (LCD) and an organic light emitting display (OLED), and a driving circuit to drive the display panel, has a gate driver to drive the gate lines.

The gate driver uses a shift register to sequentially supply a scan signal to the gate lines. The shift register consists of a plurality of stages, and each stage is configured to sequentially output the scan signal.

However, if an arbitrary stage is abnormality operated in the shift register, all stages after being abnormally generated are affected by the output of the shift register that is abnormally operated, thereby causing an erroneous operation.

As a method to solve the drawback of the shift register, there is a method using a decoder. The decoder has a characteristic that each stage generates its own output independently on the output of the previous stage, as an operating voltage of the gate is prevented from being changed by this characteristic and a consistent and low impedance output is provided, thereby preventing the problem when using the shift register.

However, in the decoder, a number of input signals is changed depending on the size of the driving circuit, that is, the area of the sensor or the display panel, and when the area of the sensor or the display panel is large, a large number of input signals is required. Therefore, when the area of the sensor or the display panel is large, usage of the decoder is inappropriate.

Accordingly, a technique for increasing a yield by driving the shift register regardless of the abnormal stage even if the one arbitrary stage is abnormally operated while the number of input signals required for driving is not affected although the area of the sensor or display panel is large, is required.

The above information disclosed in this Background section is only for enhancement of understanding of the background of the invention and therefore it may contain information that does not form the prior art that is already known in this country to a person of ordinary skill in the art.

SUMMARY OF THE INVENTION

An exemplary embodiment of the present invention provides the shift register that increases the yield without affecting the number of input signals required for the driving even if the area of the sensor or the display panel becomes large.

The exemplary embodiment of the present invention may be used to obtain other technical objects that are not mentioned in detail.

A shift register according to an exemplary embodiment of the present invention is configured of a plurality of stages applying two clock signals among four clock signals that are sequentially generated as an input and applying a start signal as the input, wherein a first stage charges the start signal to a P-node and outputs a first output signal and a first carry signal by using the voltage of the P-node as a driving voltage when a first clock signal is applied, and resets the P-node when a second clock signal is applied, a second stage pre-charges a start signal input to the first stage to the P-node, charges the first carry signal to the P-node, outputs a second output signal and a second carry signal by using the voltage of the P-node as the driving voltage when the second clock signal is applied, and resets the P-node when a third clock signal is applied, and a third stage and following stages pre-charge a carry signal of the second previous stage to the P-node, charge the carry signal of the previous stage to the P-node, output the output signal and the carry signal by using the voltage of the P-node as the driving voltage when the input clock signal secondly input to the P-node is input, and reset the P-node that is charged depending on the clock signal generated after the input clock signal.

Each stage among the plurality of stages may include a start unit applying a carry signal of a previous stage from a start terminal as an input and the start signal as the input when the previous stage does not exist, a pre-charging unit having an input terminal connected to the start terminal and an output terminal coupled to the P-node of the next stage, a P-node controller maintaining the pre-charge of the P-node or the charged signal or resetting the P-node depending on the signal input from the start terminal of the current stage or the start terminal of the previous stage, and an output unit applying the signal pre-charged to the P-node and the output of the start unit as the input, bootstrapping the voltage charged to the P-node connected to a bootstrap capacitor to further increase or decrease an operating voltage when the second input clock signal input directly before the first input clock signal is applied to stably output the output signal, and resetting the voltage of the P-node and the output signal to a reset voltage depending on the output of a reset unit.

The start unit may include a first transistor diode-connected to a start terminal, the pre-charging unit may include a tenth transistor having a gate electrode and a source electrode connected to the gate electrode of the first transistor and a drain electrode coupled to the P-node of the next stage, the P-node controller may include a second transistor having a drain electrode connected to the drain electrode of the first transistor, a source electrode connected to the reset voltage, and a gate electrode connected to an input terminal of the output unit to form a P-control node between the input terminal of the output unit and the gate electrode, a third transistor having a gate electrode and a source electrode connected to a clock terminal receiving the first input clock signal and a drain electrode connected to the P-control node and resetting the P-node to the reset voltage when the first input clock signal is applied, a fourth transistor having a gate electrode applying a signal input from a start terminal or a carry signal of a second previous stage as an input, a drain electrode connected to the P-control node, and a source electrode connected to the reset voltage, and a fifth transistor having a gate electrode applying a signal input from the start terminal as an input, a drain electrode coupled to the P-control node and the first input clock, and a source electrode connected to the reset voltage, and the output unit may include sixth and eighth transistors applied with the second input clock signal and the reset voltage, charging the carry signal of a second previous stage and the carry signal of the previous stage to the P-node connected to a bootstrap capacitor, bootstrapping the carry signals charged to the P-node as the driving voltage, and generating and outputting the output signal and the carry signal, and seventh and ninth transistors resetting the output signal and the carry signal generated by the sixth and eighth transistors to a reset voltage Vreset depending on the voltage of the P control node.

The bootstrap capacitor may be formed between the P-node and the output terminal of the carry signal of the output unit or between the P-node and the output terminal of the output signal of the output unit, and the first to tenth transistors may each be a P-type thin film transistor or an N-type thin film transistor.

Two clock signals input to the plurality of stages may be two consecutive clock signals among four clock signals that are sequentially generated.

A shift register according to another exemplary embodiment of the present invention is configured of a plurality of stages applying two clock signals among four clock signals that are sequentially generated as an input and applying a start signal as the input, wherein each stage among the plurality of stages includes a start unit applying a carry signal of a previous stage from a start terminal as an input and the start signal as the input when the previous stage does not exist, a pre-charging unit having an input terminal connected to the start terminal and an output terminal coupled to the P-node of the next stage, a P-node controller maintaining the pre-charge of the P-node or the charged signal or resetting the P-node depending on the signal input from the start terminal of the current stage or the start terminal of the previous stage, and an output unit applying the signal pre-charged to the P-node and the output of the start unit as the input, bootstrapping the voltage charged to the P-node connected to a bootstrap capacitor to further increase or decrease an operating voltage when the second input clock signal input directly before the first input clock signal is applied to stably output the output signal, and resetting the voltage of the P-node and the output signal to a reset voltage depending on the output of the P-node controller.

The start unit may include a first transistor diode-connected to a start terminal, the pre-charging unit may include a tenth transistor having a gate electrode and a source electrode connected to the gate electrode of the first transistor and a drain electrode coupled to the P-node of the next stage, the P-node controller may include a second transistor having a drain electrode connected to the drain electrode of the first transistor, a source electrode connected to the reset voltage, and a gate electrode connected to an input terminal of the output unit to form a P-control node between the input terminal of the output unit and the gate electrode, a third transistor having a gate electrode and a source electrode connected to a clock terminal receiving the first input clock signal and a drain electrode connected to the P-control node and resetting the P-node to the reset voltage when the first input clock signal is applied, a fourth transistor having a gate electrode applying a signal input from a start terminal or a carry signal of a second previous stage as an input, a drain electrode connected to the P-control node, and a source electrode connected to the reset voltage, and a fifth transistor having a gate electrode applying a signal input from the start terminal as an input, a drain electrode coupled to the P-control node and the first input clock, and a source electrode connected to the reset voltage, and the output unit may include sixth and eighth transistors applied with the second input clock signal and the reset voltage, charging the carry signal of a second previous stage and the carry signal of the previous stage to the P-node connected to a bootstrap capacitor, bootstrapping the carry signals charged to the P-node as the driving voltage, and generating and outputting the output signal and the carry signal, and seventh and ninth transistors resetting the output signal and the carry signal generated by the sixth and eighth transistors to a reset voltage Vreset depending on the voltage of the P control node.

Each of the first to tenth transistors may be a P-type thin film transistor or an N-type thin film transistor.

Two clock signals input to the plurality of stages may be two consecutive clock signals among four clock signals that are sequentially generated According to an exemplary embodiment of the present invention, the shift register increasing a yield by driving the shift register regardless of the abnormal stage may be provided even if the one arbitrary stage is abnormally operated while the number of input signals required for driving is not affected although the area of the fingerprint sensor and the image sensor or display panel is large.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification. Further, detailed descriptions of well-known technologies may be omitted.

Throughout this specification and the claims which follow, unless explicitly described to the contrary, the word "comprise" or variations such as "comprises" or "comprising" will be understood to imply the inclusion of stated elements but not the exclusion of any other elements. Also, the terms "unit", "device", and "module" used in the present specification represent a unit for processing a predetermined function or operation, which can be realized by hardware, software, or a combination of hardware and software.

Throughout this specification and the claims that follow, when it is described that an element is "coupled" to another element, the element may be "directly coupled" to the other element or "electrically coupled" to the other element through a third element. Also, throughout this specification and the claims that follow, when it is described that an element is "coupling" with another element, this means that it is coupled via another element interposed therebetween.

Next, a shift register according to an exemplary embodiment of the present invention will be described with reference to FIG. 1 to FIG. 5.

Figure 1:
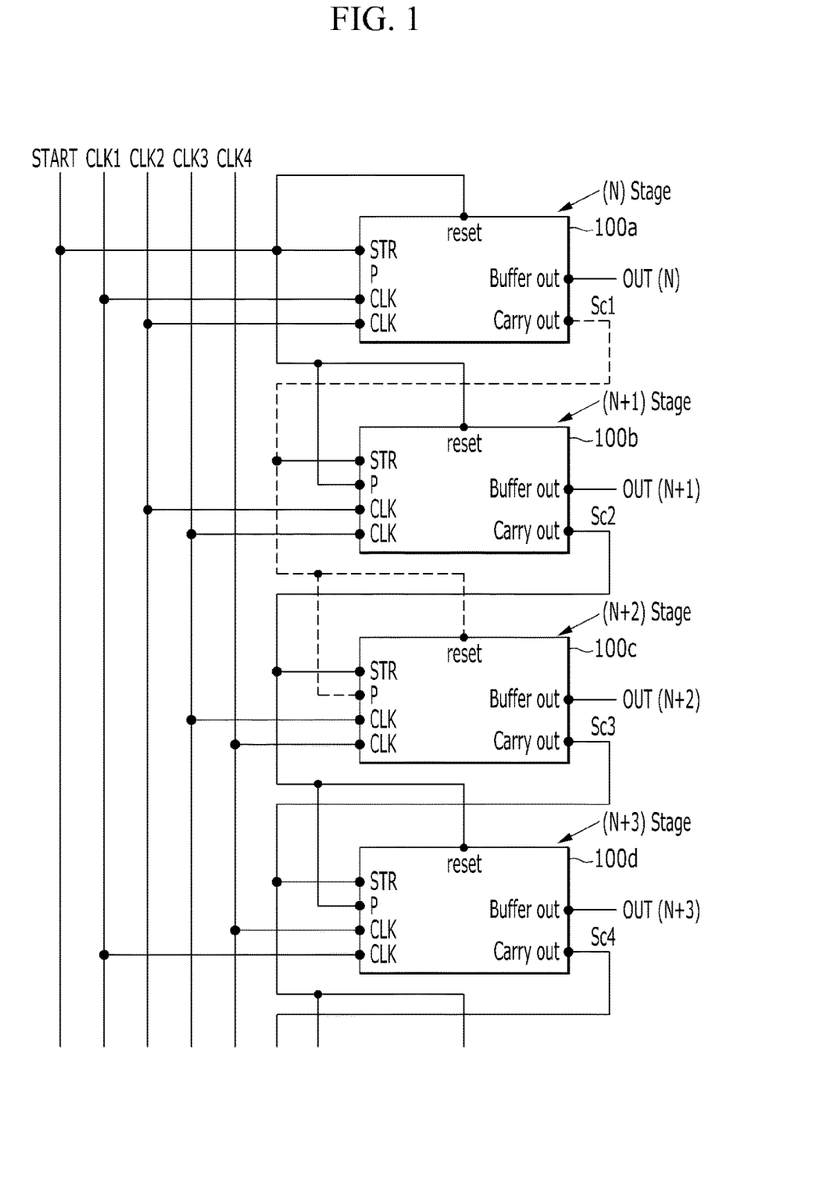
FIG. 1 is a schematic diagram of a shift register according to an exemplary embodiment of the present invention.

FIG. 1 is a schematic diagram of a shift register according to an exemplary embodiment of the present invention. Referring to FIG. 1, the shift register according to an exemplary embodiment of the present invention has a start signal START and four clock signals CLK1 to CLK4 as inputs, and includes a plurality of stages 100 having a start terminal STR, a P-node terminal P, two clock terminals CLK, a reset terminal Reset, an output signal terminal Buffer out, and a carry terminal Carry out.

Hereinafter, only an n stage as a first stage to an (n+3) stage as a fourth stage among the plurality of stages 100 configuring the shift register are described. Of course, the n+4 stage and the following stages perform the same operation as the (n+1) stage, the (n+2) stage, or the (n+3) stage. Also, hereinafter, the n stage 100 is referred to as a first stage 100a and the (n+1) stage 100 is referred to as a second stage 100b, and in the same way for the rest, the (n+2) stage 100 is referred to as a third stage 100c, and the (n+3) stage 100 is referred to as to a fourth stage 100d.

The first stage 100a to the fourth stage 100d receive two among four clock signals CLK1 to CLK4 as the input, and a start signal is sequentially input to the start terminal STR and an output signal OUT is output to the output signal terminal Butter out in sequence. In this case, the first stage 100a receives the start signal START as the input of the start terminal STR, and the following stages 100b, 100c, and 100d use the carry signal Sc of the previous stage as the input of the start terminal STR like the start signal START.

The carry signal Sc is generated at the same timing as the output signal OUT, an accordingly, each of the stages 100a to 100d sequentially generate the output signal. Also, the carry signal Sc is input to the start terminal STR of the next stage, and is simultaneously provided to the reset terminal Reset of the second next stage and the input of the P-node terminal P. However, since the first stage 100a does not have the second previous stage, the (n−1) start signal START input to the first stage 100a is input to the reset terminal Reset, and no signal is input to the P-node terminal P except for the (n−1) start signal.

In the above, the second next stage means the 2nd next stage, for example, if the current stage is the second stage 100b, it is the fourth stage 100d, while if the current stage is the first stage 100a, it is the third stage 100c. In the above, the second previous stage means the 2nd previous stage, for example, if the current stage is the fourth stage 100d, it is the second stage 100b, while if the current stage is the third stage 100c, it is the first stage 100a.

As the carry signal Sc is not only provided to the start terminal STR of the next stage but is also provided to the P terminal P of the second next stage, the carry signal Sc of the second previous stage is pre-charged through the pre-charging unit in the reset state such that the next stage starts the operation and the second next stage is not operated, and accordingly, the normal operation may be performed from the next stage regardless of a problem generated in the previous stage.

Figure 2:
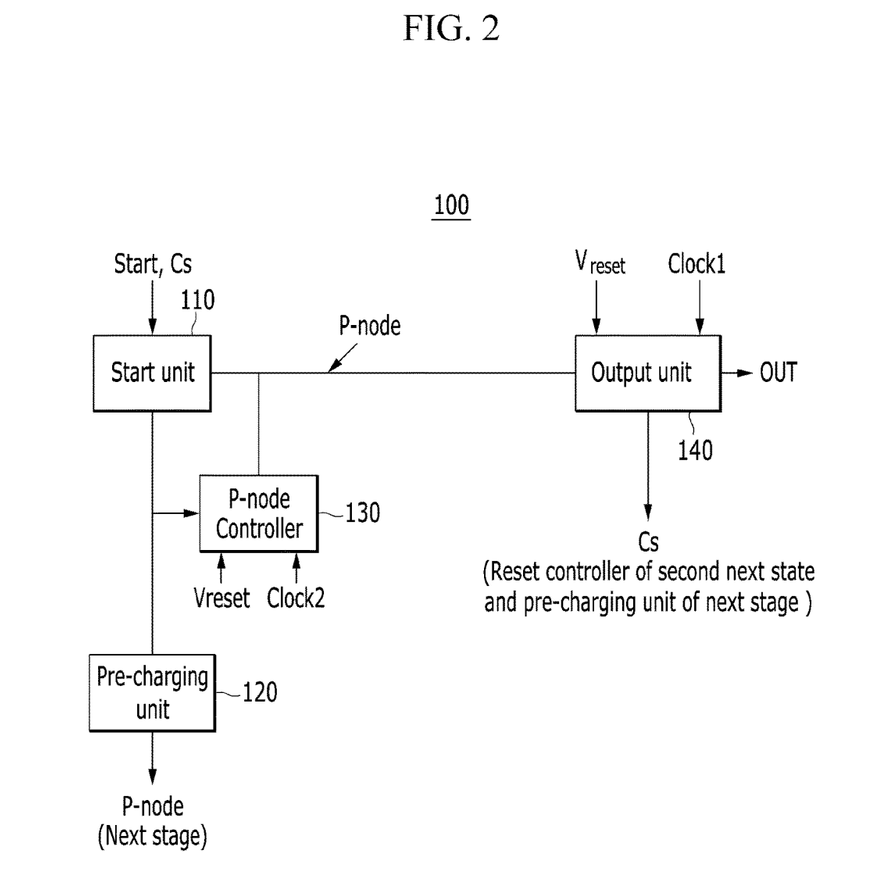
FIG. 2 is a block diagram of each stage according to an exemplary embodiment of the present invention.

Next, the configuration of each stage according to an exemplary embodiment of the present invention will be described with reference to FIG. 2. FIG. 2 is a block diagram of each stage according to an exemplary embodiment of the present invention.

Referring to FIG. 2, each stage 100 configuring the shift register according to an exemplary embodiment of the present invention includes a start unit 110, a pre-charging unit 120, a P-node controller 130, and an output unit 140.

The start unit 110 is connected to the start terminal STR to input the (n−1) start signal START received from the start terminal STR or the carry signal and to provide the (n−1) start signal START or the output signal corresponding to the carry signal to the output unit 140. In detail, the start unit 110 applies the start signal START as the input in the case of the first stage 100a, and the carry signal is used as the input after the second stage 100b.

The pre-charging unit 120 includes the input terminal connected to the start terminal STR and the output terminal coupled to the P-node of the next stage.

In the case of the first stage 100a, the P-node controller 130 is operated depending on the output signal of the start unit 110 and the Clock2 (one of two input signals), and in the case of the stage after the second stage 100b, the carry signal Cs of the second previous stage, the carry signal Cs of the previous stage, and the Clock2 are applied as the input, and the signal of the P-node charged with the carry signal Cs of the second previous stage and the carry signal Cs of the previous stage is maintained, or the P-node is reset. The second stage 100b is operated depending on the carry signal Cs of the first stage, the output of the start unit 110, and the Clock2. For example, the P-node controller 130 of the stage after the second stage 100b maintains the P-node signal pre-charged at the P-node if the carry signal Cs of the second previous stage is input, maintains the P-node signal charged at the P-node if the carry signal Cs of the previous stage is input, and resets the P-node to the reset voltage Vreset if the Clock2 is input.

The output unit 140 is applied with the Clock1 (the other one of two input signals) and the reset signal Vreset and is operated depending on the output signal provided in the start unit 110 and the output of the P-node controller 130 to simultaneously generate two output signals Cs and OUT. The output signal OUT is applied to the gate line, and the carry signal Cs is input to the start terminal STR of the next stage, and simultaneously the P-node of the second next stage is pre-charged through the pre-charging unit 120. In detail, the carry signal of the second previous stage that is pre-charged at the P-node connected to the bootstrap capacitor and the carry signal of the previous stage are bootstrapped when the Clock1 is applied to further increase or decrease the operating voltage of the output unit 140, thereby stably obtaining the on/off operation of the output unit 140. Here, when further increasing the operating voltage of the output unit 140, the output unit 140 is configured of an N-type thin film transistor (TFT), and when further decreasing the operating voltage of the output unit 140, the output unit 140 is configured of a P-type thin film transistor.

The Clock1 means the clock signal which is input temporally before the Clock2, and the Clock2 means the clock signal which is input temporally after the Clock1.

Figure 3:
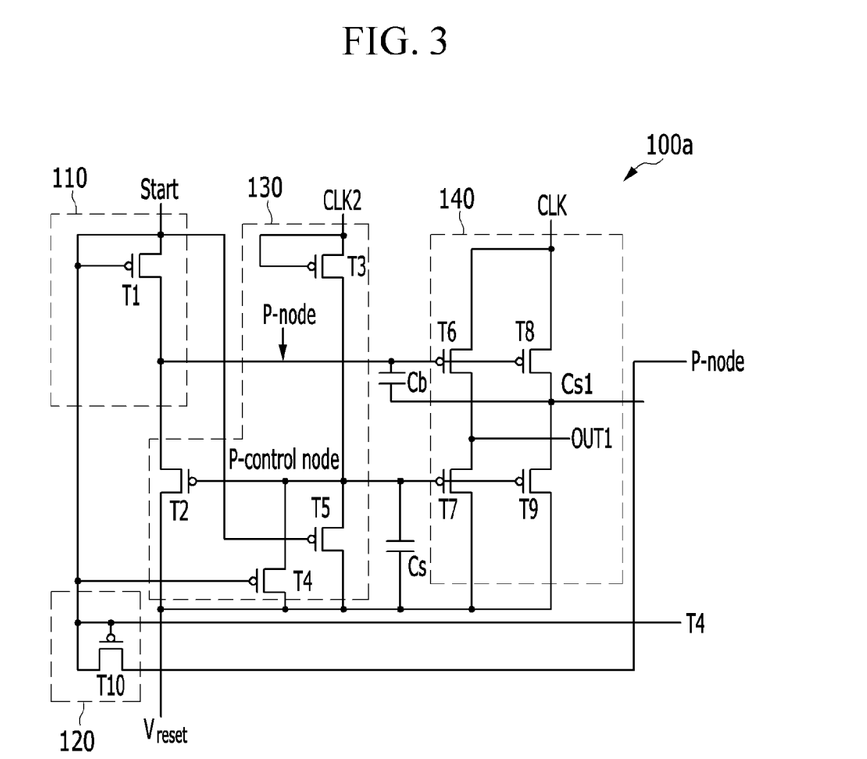
FIG. 3 is a circuit diagram of one stage according to an exemplary embodiment of the present invention.

Next, the circuit configuration of each stage will be described with reference to FIG. 3. FIG. 3 is a circuit diagram of one stage according to an exemplary embodiment of the present invention, wherein the first stage 100a is described as an example, and all the configured transistors are formed of the P-type thin film transistor.

The first stage 100a includes a start unit 110, a pre-charging unit 120, a P-node controller 130, and an output unit 140.

The start unit 110 includes a first transistor T1 of which a gate electrode and a source electrode are connected to the start terminal STR and an output terminal is connected to the drain electrode.

The pre-charging unit 120 includes a tenth transistor T10 of which a gate electrode and a source electrode are connected to the gate electrode of the first transistor T1. Here, a drain electrode as the output terminal of the tenth transistor T10 is coupled to the P-node of the second stage 100b. For the tenth transistor of the second stage 100b and the following stages, the drain electrode of the tenth transistor 10 is coupled to the P-node of the second next stage.

The P-node controller 130 includes a second, third, fourth, and fifth transistors T2, T3, T4, and T5.

In the second transistor T2, the drain electrode is connected to the drain electrode of the first transistor T1, the reset voltage Vreset is input through the source electrode, and the gate electrode is connected to the input terminal of the output unit 140, thereby forming the P-control node between the input terminal of the output unit 140 and the gate electrode. In the third transistor T3, the gate electrode and the source electrode are connected to the clock terminal to which the Clock2 is input and the drain electrode is connected to the P-control node, and makes the P-node the reset voltage Vreset when the Clock2 is applied. In the fourth transistor T4, the start signal START or the carry signal Cs is the input of the gate electrode, the drain electrode is connected to the P-control node, and the source electrode is connected to the reset voltage Vreset. In the fifth transistor T5, the start signal START or the carry signal is the input of the gate electrode, the drain electrode is connected to the P-control node and the Clock2, and the source electrode is connected to the reset voltage Vreset.

The output unit 140 includes sixth and eighth transistors applied with the Clock1 and the reset voltage Vreset, using the P-node voltage as the driving voltage, and generating and outputting the output signal and the carry signal, and seventh and ninth transistors resetting the output signal and the carry signal generated by the sixth and eighth transistors to the reset voltage Vreset depending on the P-control node voltage. In detail, the sixth and seventh transistors have the common gate and the carry signal of the second previous stage and the carry signal of the previous stage are charged at the P-node connected to the bootstrap capacitor, and as the P-node charged with the carry signals is used as the input of the gate electrode and the P-node is bootstrapped when the Clock1 is applied to the source electrode to further increase or decrease the input voltage such that the sixth and seventh transistors are turned on/off, the output signal OUT and the carry signal Cs are formed at the drain electrode. The seventh and eighth transistors have the common gate and the voltage of the P-control node is used as the input of the gate electrode, the drain electrode of the sixth or eighth transistor is connected to the drain electrode, and the reset voltage Vreset is connected to the source electrode.

Next, the connection relationship and the operation of the first stage as the n stage and the second stage as the (n+1) stage will be described with reference to FIG. 4 and FIG. 5.

Figure 4:
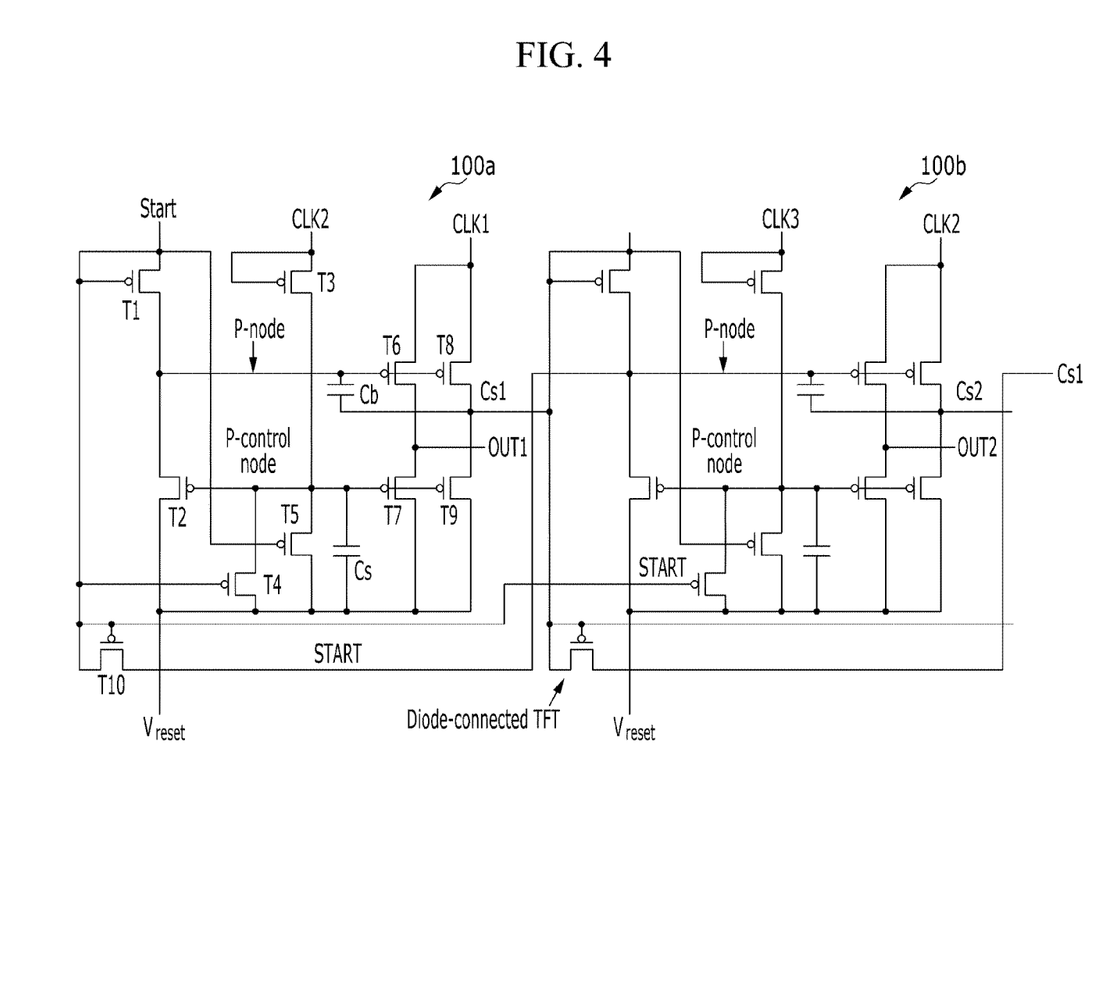
FIG. 4 is a circuit diagram of a shift register for two consecutive stages according to an exemplary embodiment of the present invention.

FIG. 4 is a circuit diagram for the first stage and the second stage as the circuit diagram of a shift register for two consecutive stages according to an exemplary embodiment of the present invention. FIG. 5 is a driving timing diagram of a shift register for two stages according to an exemplary embodiment of the present invention.

Referring to FIG. 4, the first stage 100a and the second stage 100b have the same circuit configuration.

In the first stage 100a, the start signal START is applied to the start terminal STR, the first clock signal CLK1 is applied to the sixth and eighth transistors T6 and T8 of the output unit 140, and the second clock signal CLK2 is applied to the third transistor T3. In this case, the fourth transistor T4 applies the start signal START as the input of the gate electrode, the tenth transistor T10 of the pre-charging unit 120 uses the start terminal STR as the input, and the drain electrode is connected to the P-node of the second stage 100b. The P-node is connected to the output terminal of the first transistor T1.

In the second stage 100b, the carry signal SC1 of the first stage 100a is applied to the start terminal STR, the second clock signal CLK2 is applied to the sixth and eighth transistors T6 and T8 of the output unit 140, and the third clock signal CLK3 is applied to the third transistor T3. In this case, the fourth transistor T4 uses the start signal START of the first stage 100a as the input of the gate electrode. Also, the tenth transistor T10 of the pre-charging unit 120 uses the carry signal Sc1 of the first stage 100a (n) and the drain electrode is connected to the P-node of the third stage 100c. The P-node is coupled to the start terminal STR of the first stage 100a through the tenth transistor T10 of the first stage 100a.

Figure 5:
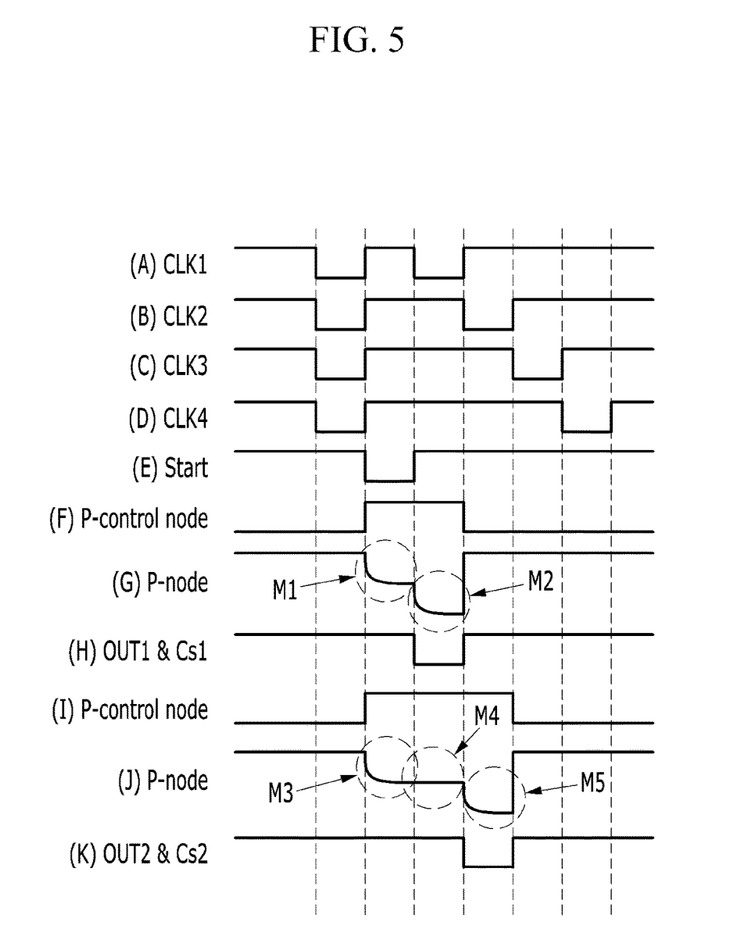
FIG. 5 is a driving timing diagram of a shift register for two stages according to an exemplary embodiment of the present invention.

Referring to FIG. 5, the operation of the first stage 100a and the second stage 100b will be described.

First, referring to the operation of the first stage 100a, in the state that the clock signals CLK1 to CLK4 are respectively synchronized like (A), (B), (C), and (D), if the start signal START is applied to the start terminal STR of the first stage 100a (n) as shown in FIG. 5 (E), the start signal START turns on the fourth and fifth transistors T4 and T5 and is charged to the P-node through the first transistor T1.

By the turning-on of the fourth and fifth transistors T4 and T5, the reset voltage Vreset is applied to the P-control node as shown in (F), and accordingly, the signal charged at the P-node is maintained like a dotted circle line M1. In this case, the second, seventh, and ninth transistors T2, T7, and T9 enter the off state depending on the reset voltage of the P-control node.

In this state, the first clock signal CLK1 is applied to the output unit 140 of the first stage 100a in synchronization with the rising edge of the start signal START. Accordingly, as shown in (H), the output signal OUT1 is output at the sixth transistor T6 of the output unit 140, and the carry signal Cs1 is output at the eighth transistor T8. In this case, like the dotted circle line M2 of (G), the P-node of the first stage 100a is bootstrapped by the bootstrap capacitor Cb and the sixth and eighth transistors T6 and T8.

Also, the second clock signal CLK2 is applied to the third transistor T3 in synchronization with the rising edge of the first clock signal CLK1. Accordingly, the third transistor T3 is turned on and the voltage corresponding to the second clock signal CLK2 is applied to the P-control node such that the second, seventh, and ninth transistors T2, T7, and T9 are turned on. Accordingly, the P-node is electrically connected to the second transistor T2 to be reset to the reset voltage Vreset, and as shown in (G), the bootstrapped voltage is reset to the reset voltage Vreset in synchronization with the second clock signal CLK2. Also, the output signal OUT1 of the sixth transistor T6 and the carry signal Sc1 of the eighth transistor T8 are reset depending on the turning-on of the seventh and ninth transistors T7 and T9.

Referring to the operation of the second stage 100b, the P-node is pre-charged by the start signal START of the first stage 100a passing through the tenth transistor T10 of the first stage 100a like the dotted circle line M3 of (J), and simultaneously the fourth transistor T4 is turned on by the start signal START of the first stage 100a such that the reset voltage Vreset is applied to the P-control node as shown in (I), thereby maintaining the signal pre-charged at the P-node. In this case, the second, seventh, and ninth transistors T2, T7, and T9 enter the off stage depending on the reset voltage of the P-control node.

In this state, the second stage 100b receives the carry signal Sc1 of the first stage 100a through the start terminal STR as the start signal START. The carry signal Sc1 is applied to the P-node to continuously charge the P-node and to turn on the fifth transistor T5 such that the reset voltage Vreset is continuously applied to the P-control node, thereby continuously keeping the signal charged to the P-node like the dotted circle line M4 of (J).

Next, the second stage 100b receives the second clock signal CLK2 along with the first stage 100a. In this case, in the second stage 100b, the second clock signal CLK2 is applied to the sixth and eighth transistors T6 and T8 of the output unit 140. As the second clock signal CLK2 is applied, as shown in (K), the output signal OUT2 is output at the sixth transistor T6 of the output unit 140, and the carry signal Cs2 is output at the eighth transistor T8.

In this case, like the dotted circle line M5 of (J), the P-node of the second stage 100b is bootstrapped by the bootstrap capacitor Cb and the sixth and eighth transistors T6 and T8.

The third clock signal CLK3 is applied to the third transistor T3 in synchronization with the rising edge of the second clock signal CLK2. Accordingly, the third transistor T3 is turned on and the voltage corresponding to the third clock signal CLK3 is applied to the P-control node such that the second, seventh, and ninth transistors T2, T7, and T9 are turned on. If the second transistor T2 is turned on, the P-node is electrically connected to the second transistor T2 to be reset to the reset voltage Vreset, and accordingly, as shown in (J), the bootstrapped voltage is reset to the reset voltage Vreset in synchronization with the third clock signal CLK3. Also, as the seventh and ninth transistors T7 and T9 are turned on, the output signal OUT2 of the sixth transistor T6 and the carry signal Sc2 of the eighth transistor T8 are reset.

Figure 6:
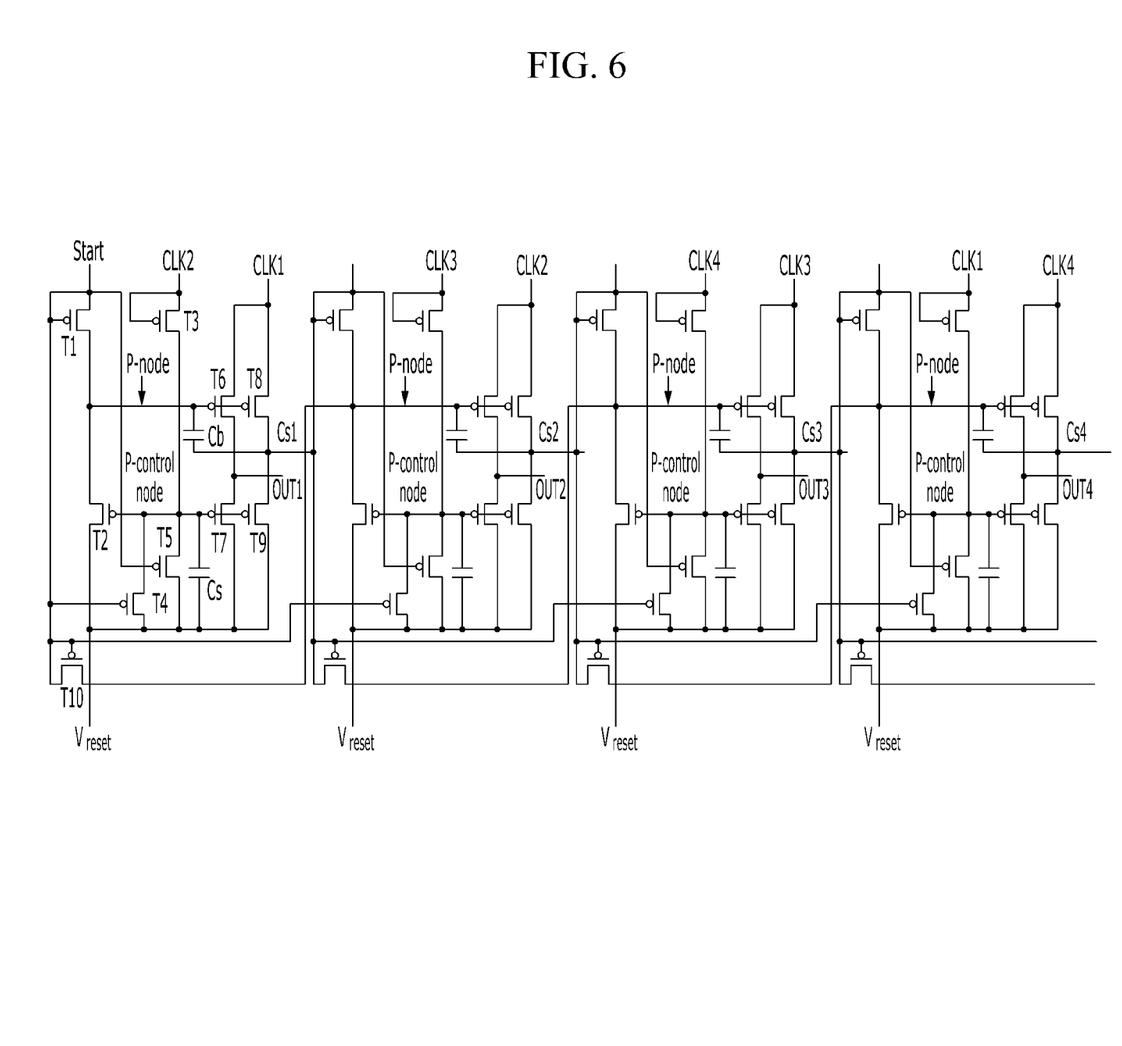
FIG. 6 is a circuit diagram of a shift register for four consecutive stages according to an exemplary embodiment of the present invention.
Figure 7:
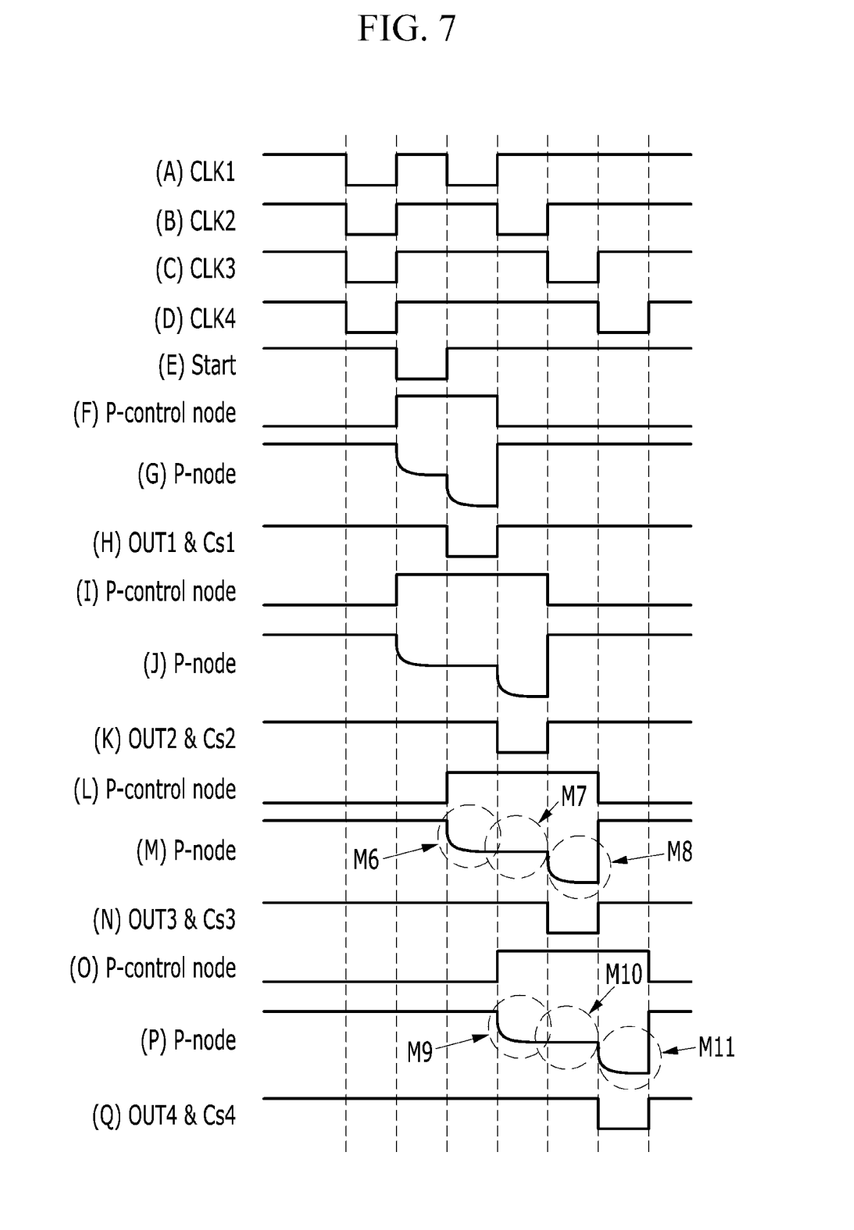
FIG. 7 is a driving timing diagram of a shift register for four stages according to an exemplary embodiment of the present invention.

Next, the entire operation of the shift register according to an exemplary embodiment of the present invention will be described with reference to FIG. 6 and FIG. 7. FIG. 6 is a circuit diagram of a shift register for four consecutive stages according to an exemplary embodiment of the present invention, and FIG. 7 is a driving timing diagram of a shift register for four stages according to an exemplary embodiment of the present invention.

Here, the shift register according to an exemplary embodiment of the present invention is an example of a case configured of four stages.

Referring to FIG. 6, the first to fourth stages 100a to 100d have the same circuit configuration. In this case, the third stage 100c and the fourth stage 100d having two or more previous stages have the same connection relationship, however the first stage 100a and the second stage 100b do not have the previous stage or have one previous stage such that they have a different connection relationship from the third stage 100c and the fourth stage 100d. This connection relationship of the first stage 100a and the second stage 100b was described with reference to FIG. 4 and FIG. 5 such that further explanation will be omitted in the following.

In the third stage 100c, the carry signal SC1 of the second stage 100b is applied to the start terminal STR, the third clock signal CLK3 is applied to the sixth and eighth transistors T6 and T8 of the output unit 140, and the fourth clock signal CLK4 is applied to the third transistor T3. In this case, the fourth transistor T4 applies the carry signal Sc1 of the first stage 100a as the input of the gate electrode through the tenth transistor T10 of the second stage 100b. The tenth transistor T10 of the pre-charging unit 120 applies the carryout signal Sc2 of the second stage 100b as the input and the drain electrode is connected to the P-node of the fourth stage 100d. The P-node is coupled to the carry signal terminal (Carry out) of the first stage 100a through the tenth transistor T10 of the second stage 100b.

In the fourth stage 100d, the carry signal SC1 of the third stage 100c is applied to the start terminal STR, the fourth clock signal CLK4 is applied to the sixth and eighth transistors T6 and T8 of the output unit 140, and the first clock signal CLKa is applied to the third transistor T3. In this case, the fourth transistor T4 applies the carry signal Sc2 of the second stage 100b as the input of the gate electrode through the tenth transistor T10 of the third stage 100c. Also, the tenth transistor T10 of the pre-charging unit 120 applies the carry signal Sc3 of the third stage 100c as the input and outputs the carry signal Sc3. The P-node is coupled to the carry signal terminal (Carry out) of the second stage 100b through the tenth transistor T10 of the third stage 100c.

The operation of the first to fourth stages 100a to 100d is described with reference to FIG. 7. Before the description, the operation of the first stage 100a and the second stage 100b was previously described with reference to FIG. 5 such that the operation of the third stage 100c and the fourth stage 100d is described.

First, referring to the third stage 100c, the P-node is pre-charged by the carry signal Sc1 of the first stage 100a like the dotted circle line M6 of (M), and simultaneously the fourth transistor T4 is turned on by the carry signal Sc1 of the first stage 100a to apply the reset voltage Vreset to the P-control node as shown in (L), such that the pre-charged signal is maintained as the P-node. In this state, the third stage 100b receives the carry signal Sc2 of the second stage 100b as the start signal START through the start terminal STR. The carry signal Sc2 is applied to the P-node to continuously charge the P-node and to turn on the fifth transistor T5 to apply the reset voltage Vreset to the P-control node such that the signal charged to the P-node is continuously maintained like the dotted circle line M7 of (M). In this case, the second, seventh, and ninth transistors T2, T7, and T9 enter the off state depending on the reset voltage of the P-control node.

Next, the third stage 100c receives the third clock signal CLK3. In this case, in the third stage 100c, the third clock signal CLK3 is applied to the sixth and eighth transistors T6 and T8 of the output unit 140. As the third clock signal CLK3 is applied, as shown in (N), the output signal OUT3 is output at the sixth transistor T6 of the output unit 140, and the carry signal Cs3 is output at the eighth transistor T8.

In this case, like the dotted circle line M8 of (M), the P-node of the third stage 100c is bootstrapped by the bootstrap capacitor Cb and the sixth and eighth transistors T6 and T8.

Also, the fourth clock signal CLK4 is applied to the third transistor T3 in synchronization with the rising edge of the third clock signal CLK3. Accordingly, the third transistor T3 is turned on to apply the voltage corresponding to the third clock signal CLK3 to the P-control node such that the second, seventh, and ninth transistors T2, T7, and T9 are turned on. If the second, transistor T2 is turned on, the P-node is electrically connected to the second transistor T2 to be reset to the reset voltage Vreset, and as shown in (M), the bootstrapped voltage is reset to the reset voltage Vreset in synchronization with the fourth clock signal CLK4. Also, the output signal OUT3 of the sixth transistor T6 and the carryout signal Sc3 of the eighth transistor T8 are reset depending on the turning-on of the seventh and ninth transistors T7 and T9.

Next, referring to the operation of the fourth stage 100d, the P-node is pre-charged by the carryout signal Sc2 of the second stage 100b like the dotted circle line M9 of (P), and simultaneously the fourth transistor T4 is turned on by the carryout signal Sc2 of the second stage 100b to apply the reset voltage Vreset to the P-control node as shown in (O), such that the pre-charged signal is maintained at the P-node.

In this state, the fourth stage 100d receives the carryout signal Sc3 of the third stage 100c through the start terminal STR as the start signal START. The carryout signal Sc3 is applied to the P-node to charge the P-node and to turn on the fifth transistor T5 to continuously apply the reset voltage Vreset to the P-node control node such that the charged signal is continuously maintained at the P-node like the dotted circle line M10 of (P). In this case, the second, seventh, and ninth transistors T2, T7, and T9 enter the off state depending on the reset voltage of the P-control node.

Next, the fourth stage 100d receives the fourth clock signal CLK4 along with the third stage 100c. In this case, in the fourth stage 100d, the fourth clock signal CLK4 is applied to the sixth and eighth transistors T6 and T8 of the output unit 140.

As the fourth clock signal CLK4 is applied, as shown in (Q), the output signal OUT4 is output at the sixth transistor T6 of the output unit 140 and the carry signal Cs4 is output at the eighth transistor T8. In this case, like the dotted circle line M11 of (P), the P-node of the fourth stage 100d is bootstrapped by the bootstrap capacitor Cb and the sixth and eighth transistors T6 and T8.

Also, the first clock signal CLK1 is applied to the third transistor T3 in synchronization with the rising edge of the fourth clock signal CLK4. Accordingly, the third transistor T3 is turned on to apply the voltage corresponding to the third clock signal CLK3 to the P-control node such that the second, seventh, and ninth transistors T2, T7, and T9 are turned on. If the second transistor T2 is turned on, the P-node is electrically connected to the second transistor T2 to be reset to the reset voltage Vreset, and accordingly, as shown in (P), the bootstrapped voltage is reset to the reset voltage Vreset in synchronization with the fourth clock signal CLK4.

In the above-described exemplary embodiment, the first to tenth transistors are configured as the P-type thin film transistors, however as another example, the first to tenth transistors may be configured as N-type thin film transistors. When the first to tenth transistors are configured as the N-type thin film transistors, a normal technician can easily realize the above-mentioned example embodiment, so a detailed description will be omitted.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| 100a: first stage | 100b: second stage |
|---|---|
| 100c: third stage | 100d: fourth stage |
| 110: start unit | 120: pre-charging unit |
| 130: P-node controller | 140: output unit |
| 100: shift register | |

What is claimed is:

1. A shift register configured of a plurality of stages applying two clock signals among four clock signals that are sequentially generated as an input and applying a start signal as the input, wherein a first stage charges the start signal to a P-node and outputs a first output signal and a first carry signal by using the voltage of the P-node as a driving voltage when a first clock signal is applied, and resets the P-node when a second clock signal is applied, a second stage pre-charges a start signal input to the first stage to the P-node, charges the first carry signal to the P-node, outputs a second output signal and a second carry signal by using the voltage of the P-node as the driving voltage when the second clock signal is applied, and resets the P-node when a third clock signal is applied, and a third stage and following stages pre-charge a carry signal of the second previous stage to the P-node, charge the carry signal of the previous stage to the P-node, output the output signal and the carry signal by using the voltage of the P-node as the driving voltage when the input clock signal secondly input to the P-node is input, and reset the P-node charged depending on the clock signal that is generated after the input clock signal.

2. The shift register of claim 1, wherein each stage among the plurality of stages includes a start unit applying a carry signal of a previous stage from a start terminal as an input and the start signal as the input when the previous stage does not exist, a pre-charging unit having an input terminal connected to the start terminal and an output terminal coupled to the P-node of the next stage, a P-node controller maintaining the pre-charge of the P-node or the charged signal or resetting the P-node depending on the signal input from the start terminal of the current stage or the start terminal of the previous stage, and an output unit applying the signal pre-charged to the P-node and the output of the start unit as the input, bootstrapping the voltage charged to the P-node connected to a bootstrap capacitor to further increase or decrease an operating voltage when the second input clock signal input directly before the first input clock signal is applied to stably output the output signal, and resetting the voltage of the P-node and the output signal to a reset voltage depending on the output of the P-node controller.

3. The shift register of claim 2, wherein the start unit includes a first transistor diode-connected to a start terminal, the pre-charging unit includes a tenth transistor having a gate electrode and a source electrode connected to the gate electrode of the first transistor and a drain electrode coupled to the P-node of the next stage, the P-node controller includes a second transistor having a drain electrode connected to the drain electrode of the first transistor, a source electrode connected to the reset voltage, and a gate electrode connected to an input terminal of the output unit to form a P-control node between the input terminal of the output unit and the gate electrode, a third transistor having a gate electrode and a source electrode connected to a clock terminal receiving the second input clock signal and a drain electrode connected to the P-control node and resetting the P-node to the reset voltage when the second input clock signal is applied, a fourth transistor having a gate electrode applying a signal input from a start terminal or a carry signal of a second previous stage as an input, a drain electrode connected to the P-control node, and a source electrode connected to the reset voltage, and a fifth transistor having a gate electrode applying a signal input from the start terminal as an input, a drain electrode coupled to the P-control node and the second input clock signal, and a source electrode connected to the reset voltage, and the output unit includes sixth and eighth transistors applied with the first input clock signal and the reset voltage, charging the carry signal of a second previous stage and the carry signal of the previous stage to the P-node connected to a bootstrap capacitor, bootstrapping the carry signals charged to the P-node as the driving voltage, and generating and outputting the output signal and the carry signal, and seventh and ninth transistors resetting the output signal and the carry signal generated by the sixth and eighth transistors to the reset voltage depending on the voltage of the P control node.

4. The shift register of claim 3, wherein
each of the first to tenth transistors is a P-type thin film transistor.

5. The shift register of claim 3, wherein
each of the first to tenth transistors is an N-type thin film transistor.

6. The shift register of claim 1, wherein
two clock signals input to the plurality of stages are two consecutive clock signals among four clock signals that are sequentially generated.

7. A shift register configured of a plurality of stages applying two clock signals among four clock signals that are sequentially generated as an input and applying a start signal as the input, wherein each stage among the plurality of stages includes a start unit applying a carry signal of a previous stage from a start terminal as an input and the start signal as the input when the previous stage does not exist, a pre-charging unit having an input terminal connected to the start terminal and an output terminal coupled to the P-node of the next stage, a P-node controller maintaining the pre-charge of the P-node or the charged signal or resetting the P-node depending on the signal input from the start terminal of the current stage or the start terminal of the previous stage, and an output unit applying the signal pre-charged to the P-node and the output of the start unit as the input, bootstrapping the voltage charged to the P-node connected to a bootstrap capacitor to further increase or decrease an operating voltage when a first input clock signal input directly before a second input clock signal is applied to stably output the output signal, and resetting the voltage of the P-node and the output signal to a reset voltage depending on the output of the P-node controller.

8. The shift register of claim 7, wherein
the start unit includes a first transistor diode-connected to a start terminal, the pre-charging unit includes a tenth transistor having a gate electrode and a source electrode connected to the gate electrode of the first transistor and a drain electrode coupled to the P-node of the next stage, the P-node controller includes a second transistor having a drain electrode connected to the drain electrode of the first transistor, a source electrode connected to the reset voltage, and a gate electrode connected to an input terminal of the output unit to form a P-control node between the input terminal of the output unit and the gate electrode, a third transistor having a gate electrode and a source electrode connected to a clock terminal receiving the second input clock signal and a drain electrode connected to the P-control node and resetting the P-node to the reset voltage when the second input clock signal is applied, a fourth transistor having a gate electrode applying a signal input from a start terminal or a carry signal of a second previous stage as an input, a drain electrode connected to the P-control node, and a source electrode connected to the reset voltage, and a fifth transistor having a gate electrode applying a signal input from the start terminal as an input, a drain electrode coupled to the P-control node and the second input clock signal, and a source electrode connected to the reset voltage, and the output unit includes sixth and eighth transistors applied with the first input clock signal and the reset voltage, charging the carry signal of a second previous stage and the carry signal of the previous stage to the P-node connected to a bootstrap capacitor, bootstrapping the carry signals charged to the P-node as the driving voltage, and generating and outputting the output signal and the carry signal, and seventh and ninth transistors resetting the output signal and the carry signal generated by the sixth and eighth transistors to the reset voltage depending on the voltage of the P control node.

9. The shift register of claim 8, wherein
each of the first to tenth transistors is a P-type thin film transistor.

10. The shift register of claim 8, wherein
each of the first to tenth transistors is an N-type thin film transistor.

11. The shift register of claim 7, wherein
two clock signals input to the plurality of stages are two consecutive clock signals among four clock signals that are sequentially generated.

* * * * *